US007009889B2

(12) United States Patent
Tran et al.

(10) Patent No.: US 7,009,889 B2
(45) Date of Patent: Mar. 7, 2006

(54) COMPREHENSIVE ERASE VERIFICATION FOR NON-VOLATILE MEMORY

(75) Inventors: Dat Tran, San Jose, CA (US); Kiran Ponnuru, Sunnyvale, CA (US); Jian Chen, San Jose, CA (US); Jeffrey W. Lutze, San Jose, CA (US); Jun Wan, Sunnyvale, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 10/857,245

(22) Filed: May 28, 2004

(65) Prior Publication Data

US 2005/0265081 A1    Dec. 1, 2005

(51) Int. Cl.
    *G11C 16/04*    (2006.01)
(52) U.S. Cl. .......................... 365/185.29; 365/185.17; 365/185.21
(58) Field of Classification Search ........... 365/185.29, 365/185.17, 185.21, 185.33, 189.05, 149, 365/189.06
    See application file for complete search history.

(56) References Cited

U.S. PATENT DOCUMENTS

| 5,172,338 | A |   | 12/1992 | Mehrotra et al. |
|-----------|---|---|---------|-----------------|
| 5,265,059 | A |   | 11/1993 | Wells et al. |
| 5,347,490 | A |   | 9/1994  | Terada et al. |
| 5,521,865 | A |   | 5/1996  | Ohuchi et al. |
| 5,546,351 | A |   | 8/1996  | Tanaka et al. |
| 5,570,315 | A |   | 10/1996 | Tanaka et al. |
| 5,590,074 | A |   | 12/1996 | Akaogi et al. |
| 5,602,987 | A |   | 2/1997  | Harari et al. |
| 5,652,719 | A |   | 7/1997  | Tanaka et al. |
| 5,815,439 | A |   | 9/1998  | Korsch et al. |
| 5,870,334 | A |   | 2/1999  | Hemink et al. |
| 5,901,089 | A |   | 5/1999  | Korsch et al. |
| 5,905,344 | A |   | 5/1999  | Vrionis |
| 5,905,461 | A |   | 5/1999  | Neher |
| 5,936,890 | A | * | 8/1999  | Yeom ..................... 365/185.22 |
| 5,949,714 | A |   | 9/1999  | Hemink et al. |
| 5,969,985 | A |   | 10/1999 | Tanaka et al. |
| 5,991,206 | A | * | 11/1999 | Shin ..................... 365/185.29 |
| 5,999,446 | A |   | 12/1999 | Harari et al. |
| 6,011,722 | A |   | 1/2000  | Bude et al. |
| 6,014,330 | A |   | 1/2000  | Endoh et al. |
| 6,044,013 | A |   | 3/2000  | Tanaka et al. |

(Continued)

*Primary Examiner*—Anh Phung
*Assistant Examiner*—Dang Nguyen
(74) *Attorney, Agent, or Firm*—Vierra Magen Marcus; Harmon & DeNiro LLP

(57) ABSTRACT

Systems and methods in accordance with various embodiments can provide for comprehensive erase verification and defect detection in non-volatile semiconductor memory. In one embodiment, the results of erasing a group of storage elements is verified using a plurality of test conditions to better detect defective and/or insufficiently erased storage elements of the group. For example, the results of erasing a NAND string can be verified by testing charging of the string in a plurality of directions with the storage elements biased to turn on if in an erased state. If a string of storage elements passes a first test process or operation but fails a second test process or operation, the string can be determined to have failed the erase process and possibly be defective. By testing charging or conduction of the string in a plurality of directions, defects in any transistors of the string that are masked under one set of conditions may be exposed under a second set of bias conditions. For example, a string may pass an erase verification operation but then be read as including one or more programmed storage elements. Such a string can be defective and mapped out of the memory device.

59 Claims, 9 Drawing Sheets

U.S. PATENT DOCUMENTS

| | | |
|---|---|---|
| 6,081,453 A | 6/2000 | Iwahashi |
| 6,128,242 A | 10/2000 | Banba et al. |
| 6,134,140 A | 10/2000 | Tanaka et al. |
| 6,208,560 B1 | 3/2001 | Tanaka et al. |
| 6,222,767 B1 | 4/2001 | Kendall et al. |
| 6,236,609 B1 | 5/2001 | Tanzawa et al. |
| 6,282,117 B1 | 8/2001 | Tanaka et al. |
| 6,363,010 B1 | 3/2002 | Tanaka et al. |
| 6,373,746 B1 | 4/2002 | Takeuchi et al. |
| 6,373,748 B1 | 4/2002 | Ikehashi et al. |
| 6,418,054 B1 | 7/2002 | Hollmer |
| 6,434,055 B1 | 8/2002 | Tanaka et al. |
| 6,438,037 B1 | 8/2002 | Fastow et al. |
| 6,483,750 B1 * | 11/2002 | Dallabora et al. ..... 365/185.23 |
| 6,498,752 B1 | 12/2002 | Hsu et al. |
| 6,512,701 B1 | 1/2003 | Hamilton et al. |
| 6,512,702 B1 | 1/2003 | Yamamura et al. |
| 6,519,184 B1 * | 2/2003 | Tanaka et al. ......... 365/185.22 |
| 6,523,132 B1 | 2/2003 | Harari et al. |
| 6,545,909 B1 | 4/2003 | Tanaka et al. |
| 6,549,464 B1 | 4/2003 | Tanaka et al. |
| 6,560,143 B1 | 5/2003 | Conley et al. |
| 6,562,992 B1 | 5/2003 | Hayashi et al. |
| 6,665,214 B1 | 12/2003 | Cheah et al. |
| 6,684,345 B1 | 1/2004 | Harari et al. |
| 6,798,698 B1 | 9/2004 | Tanaka et al. |
| 2002/0031038 A1 | 3/2002 | Honda et al. |
| 2002/0080660 A1 | 6/2002 | Kanamitsu et al. |
| 2002/0163840 A1 | 11/2002 | Hiraki et al. |
| 2003/0051093 A1 | 3/2003 | Takeuchi |
| 2003/0074152 A1 | 4/2003 | Kessenich et al. |
| 2003/0086295 A1 | 5/2003 | Honda et al. |
| 2003/0151960 A1 | 8/2003 | Hiraki et al. |
| 2003/0206438 A1 | 11/2003 | Shibata et al. |
| 2003/0206449 A1 | 11/2003 | Harari et al. |
| 2003/0214853 A1 | 11/2003 | Hosono et al. |
| 2005/0013169 A1 | 1/2005 | Tanaka et al. |
| 2005/0041515 A1 * | 2/2005 | Futatsuyama et al. ...... 365/232 |

* cited by examiner

| Operation | Erase Verify | Read for erased state | Read |
|---|---|---|---|
| $V_{bitline}$ | 0V | 0.7V | 0.7V |
| $V_{sgd}$ | $V_{read}$ (5.0V) | $V_{cc}+V_t$ (4.1V) | $V_{cc}+V_t$ (4.1V) |
| $WL_3$ | 0V | $V_{verify}$ | Vread (5.0V) |
| $WL_2$ | 0V | $V_{verify}$ | Vread (5.0V) |
| $WL_1$ | 0V | $V_{verify}$ | Vread (5.0V) |
| $WL_0$ | 0V | $V_{verify}$ | 0V |
| $V_{sgs}$ | $V_{read}$ (5.0V) | $V_{cc}+V_t$ (4.1V) | $V_{cc}+V_t$ (4.1V) |
| $V_{source}$ | $V_{dd}$ (2.7V) | 0V | 0V |
| evaluation time | 9.2μsec | 6.7μsec | 6.7μsec |
| evaluation voltage | $V_{sense}$(~1.5V) | $V_{sense}$(~0.45V) | $V_{sense}$(~0.45V) |

COMPREHENSIVE ERASE VERIFICATION FOR NON-VOLATILE MEMORY

BACKGROUND OF THE INVENTION

1. Field of the Invention

The present invention relates generally to technology for programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG for select gate 120. Select gate 122 is controlled by applying the appropriate voltages to control gate 122CG of select gate 122. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "00", and "01." In one example of a NAND type memory, the threshold voltage after an erase operation is negative and defined as "11". Positive threshold voltages are used for the states of "10", "00", and "01."

Typically, a block or other unit of memory cells is erased prior to programming the memory cells to one or more threshold voltage levels as well as in response to a request to erase a portion of the memory. In one embodiment, a block or sector can refer to a minimum number of memory cells that are simultaneously erased. An entire memory device or one or more blocks can be erased during operation of the device.

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. Pat. Application. Ser. No. 09/893,277 (Publication No. U.S. 2003/0002348). Other types of flash memory devices can also be used in accordance with embodiments of the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

During manufacturing, it is possible that some flash memory devices or portions thereof become defective. Individual transistors, strings, or blocks of storage elements may be defective and unusable. Additionally, defects in the device may arise after the manufacturing process or during user operation. Defects can be effectively managed in most situations by using error correction codes (ECC) or simply not using defective portions of the device. Individual cells, strings, or blocks can be mapped to alternate areas of the memory device, such as predesignated alternate strings at the end of a block. If left undetected, however, defects can cause erroneous erase verification and in some cases, irretrievable user data. Accordingly, various techniques are employed to detect and accommodate defects in flash memory devices.

Defects in flash memory can be discovered during programming and erasing of flash memory. Groups of cells having defective storage elements or select gates will not program or erase properly, indicating a problem with one or more of the devices in the string. During manufacturing, defects in flash memory may be discovered during a number of routine testing operations that are performed as part of the manufacturing process. For example, portions of the device may be erased and then verified for an erased condition. Those cells that fail a number of erase attempts may be determined to be defective and handled under one or more defect management schemes.

The manufacturing process also typically includes reading each cell to determine if it is functioning properly. For example, after erasing a group of cells or programming a random pattern to the group, each of the individual cells of the group are individually read. If the state of a cell does not match the value for which it was programmed, it can be determined to be defective.

During user operation, defects can be detected by cells, strings, or blocks that fail to erase or program properly. For example, if a cell fails to erase after a number of attempts, the cell can be determined to be defective. Similarly, if a cell fails to program to a desired state after a number of attempts, it can be determined to be defective. During manufacturing and user operation, erase verification is typically performed by testing a group of cells in a single step.

Although these techniques can discover some defects in a memory device and verify erasure to an extent, they may not fully verify that cells are erased and detect all defects in the device.

Accordingly, there is a need for an improved system and method to verify erase operations and detect defects in non-volatile memory.

SUMMARY OF THE INVENTION

The present invention, roughly described, pertains to technology for detecting defects in non-volatile memory. Systems and methods in accordance with various embodiments can verify the results of erase operations using a plurality of test conditions to better detect defective and/or insufficiently erased storage elements of the group.

In one embodiment, a group of storage elements is erased and tested to determine if the elements are in an erased state as a result of the erase process. An initial erase verify process may be performed on a group of cells after applying an erase pulse or voltage to the group. In an erase verification process of a NAND string, for example, the elements are biased to turn on if erased and charging or conduction through the NAND string in a first direction is determined. If the conduction or charging is above a minimum level, the group passes the initial erase verification. Further pulsing and verifying is performed until the group is erased or until a predetermined number of attempts are made. In one embodiment, storage elements that do not successfully pass an erase verification process are mapped to other sectors of the memory device.

In one embodiment, a group of storage elements is also read for an erased state after being erased. In the read for erased state process, one or more storage elements of a group can be read to determine their respective state. In one embodiment, each storage element of a group is biased to turn if erased and charging or conduction through the group in a second direction is determined. If the charging or conduction is above a minimum level, the string is read as erased. In one embodiment, each cell of a NAND string is simultaneously read for an erased state to minimize the time for performing the additional process.

In one embodiment, the erase verification process and read for erased state process test conduction or charging through a group of storage elements in opposite directions. For example, in an erase verification process, the bit line of a NAND string can be monitored to determine if it charges to a predetermined level with each storage element biased to turn on if erased and the bit and source lines biased in a first direction. If the bit line charges to the predetermined level, the string is verified as being erased. During a read for an erased state, the bit line can be monitored to determine if it discharges below a predetermined level with each storage element biased to turn on if erased and the bit and source lines biased in a second direction. If the bit line discharges below the predetermined level, the string is read as erased. In this manner, the entire NAND string is simultaneously read for an erased state.

In accordance with one embodiment, a group of storage elements is only verified as in an erased state if it passes an erase verification process and is read for an erased state. Those groups of storage elements that pass an erase verification process but are read as programmed are determined to be defective. They can be excluded from further programming operations using one or more defect handling techniques such as mapping of the defective group to another group.

In accordance with one embodiment, groups of storage elements are read for an erased state only when they pass an erase verification process. Those cells that fail an erase verification process do not undergo further testing such as a read for erased state process. Accordingly, time costs incurred by implementing the extra read for erased state process are minimized.

In one embodiment, a system in accordance with an embodiment of the present invention can include an array of storage elements and a managing circuit. The managing circuit can include dedicated hardware and/or can include hardware that is programmed by software stored on one or more storage devices such as non-volatile memory (e.g. flash memory, EEPROM, etc.) or other memory devices. In one embodiment, the managing circuit includes a controller and a state machine. In another embodiment, the managing circuit only includes a state machine and not a controller. The managing circuit can perform the steps discussed above with respect to various embodiments. Methods in accordance with some embodiments are performed by the state machine. In some implementations, the state machine is on the same integrated circuit chip as the array of storage elements.

Other features, aspects, and objects of the invention can be obtained from a review of the specification, the figures, and the claims.

DETAILED DESCRIPTION

The invention is illustrated by way of example and not by way of limitation in the figures of the accompanying drawings in which like references indicate similar elements. It should be noted that references to an or one embodiment in this disclosure are not necessarily to the same embodiment, and such references mean at least one.

In the following description, various aspects of the present invention will be described. However, it will be apparent to those skilled in the art that the present invention may be practiced with only some or all aspects of the present disclosure. For purposes of explanation, specific numbers, materials, and configurations are set forth in order to provide a thorough understanding of the present invention. However, it will be apparent to one skilled in the art that the present invention may be practiced without the specific details. In other instances, well-known features are omitted or simplified in order not to obscure the present invention.

Various operations will be described as multiple discrete steps in turn, in a manner that is most helpful in understanding the present invention, however, the order of description should not be construed as to imply that these operations are necessarily order dependent.

Figure 4:
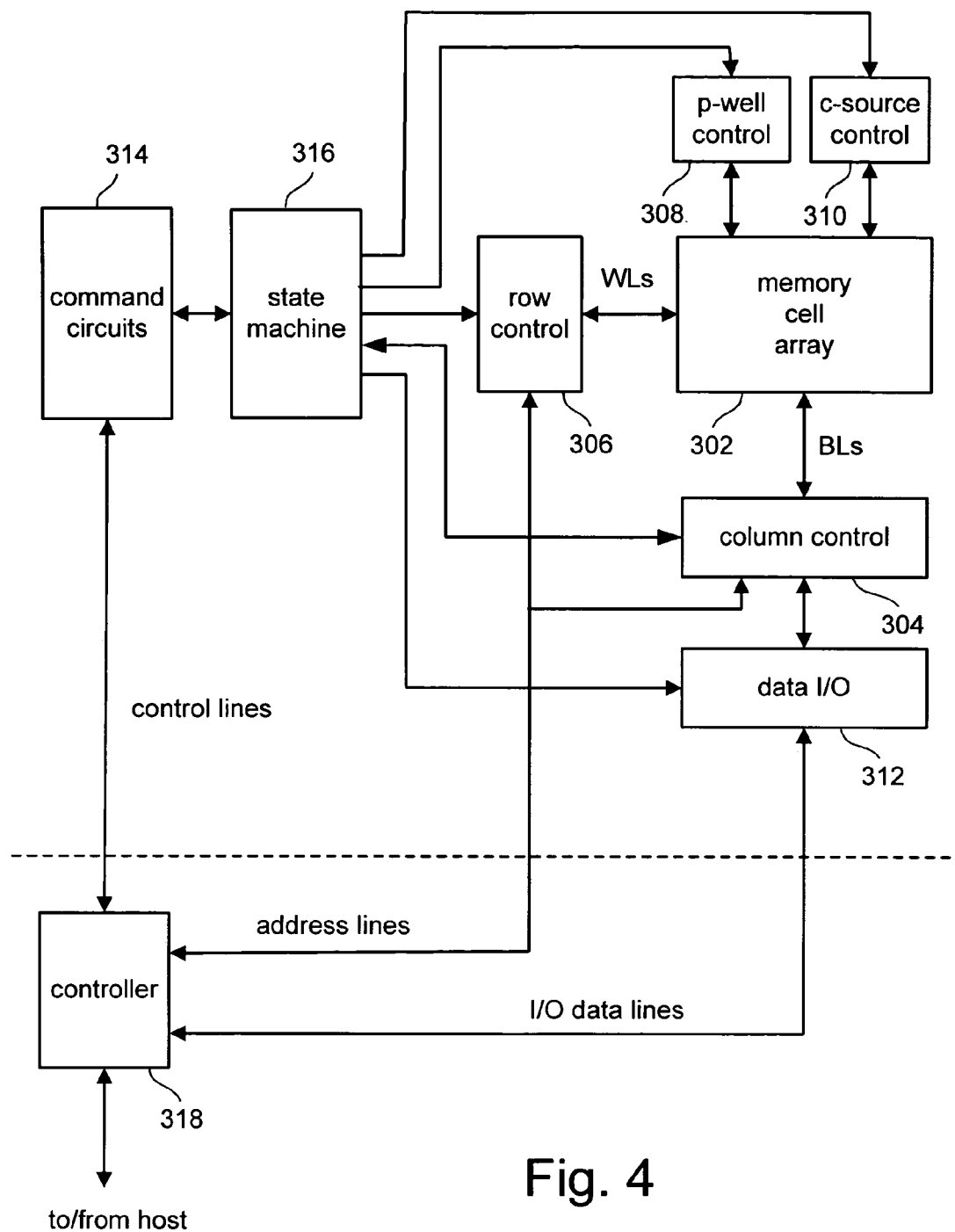
FIG. 4 is a block diagram of one embodiment of a non-volatile memory system in which the various aspects of the present invention can be implemented.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 5) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the Controller or control function being embedded in the host). Thus, the controller can be embedded in the host or included within the removable memory system.

Figure 5:
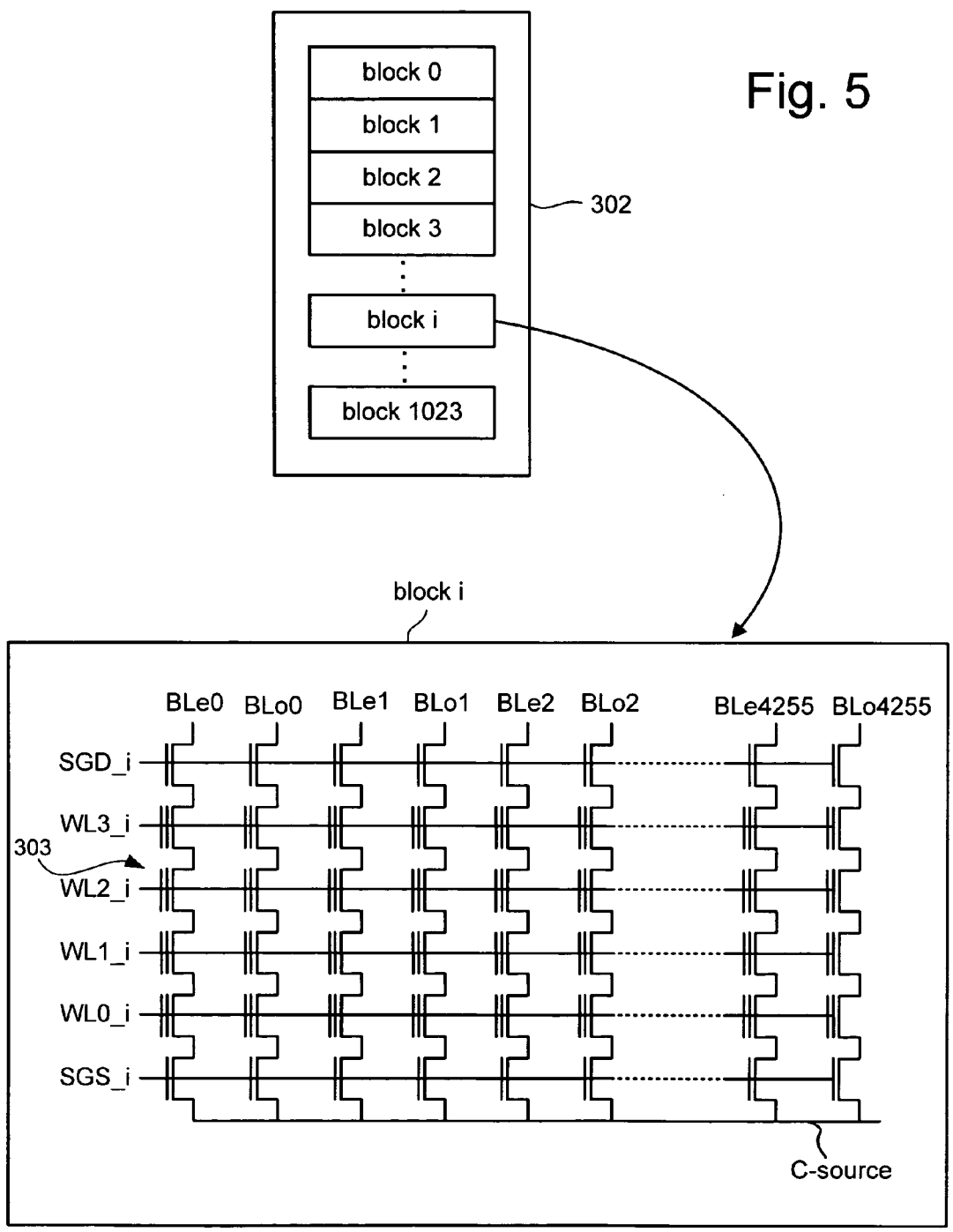
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four can be used, for example 16, 32, or another number. One terminal of the NAND string is connected to a corresponding bit line via a first select transistor SGD, and another terminal is connected to c-source via a second select transistor SGS.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

Figure 7:
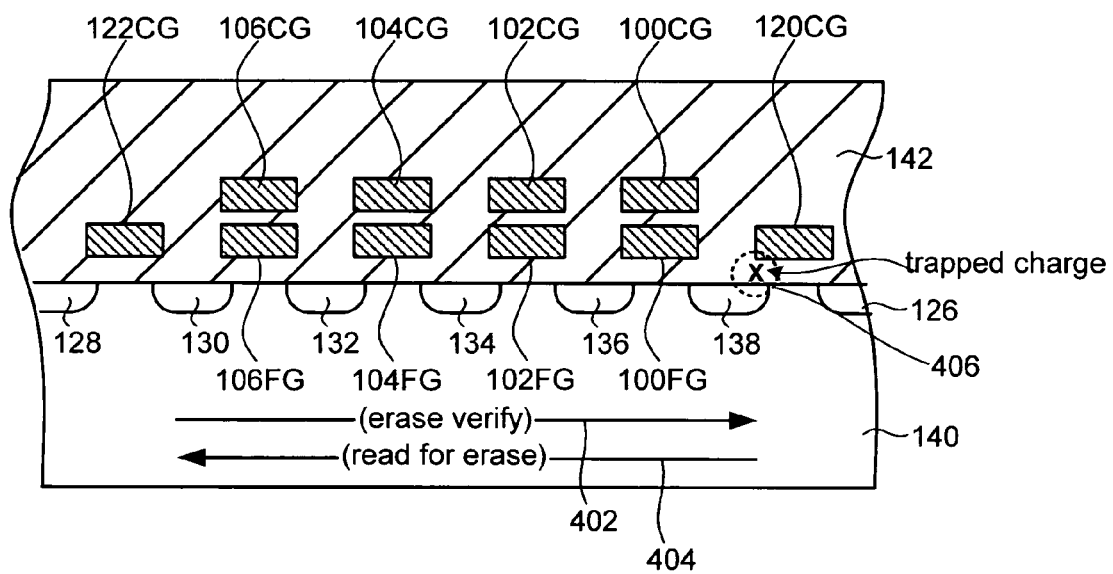
FIG. 7 is a cross-sectional view of a NAND string such as that depicted in FIG. 1.

With reference to FIG. 5, for example, in the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that it is verified whether the threshold voltage has reached 2.4V or another threshold level. The source and p-well (e.g., a p-well 140 as depicted in FIG. 7) are at zero volts. The selected bit lines (BLe) are pre-charged to a level of, for example, 0.7V. If the threshold voltage is higher than the read or verify level, the potential level of the concerned bit line (BLe) maintains the high level, because of the non-conductive memory cell. On the other hand, if the threshold voltage is lower than the read or verify level, the potential level of the concerned bit line (BLe) decreases to a low level, for example less than 0.5V, because of the conductive memory cell (e.g., memory cell 303). The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

Memory cells are erased in one embodiment by raising the p-well to an erase voltage (e.g. 20 volts) and grounding the word lines of a selected block while the source and bit lines are floating. Due to capacitive coupling, the unselected word lines, bit lines, select lines, and c-source are also raised to a high positive potential, (e.g., 20V). A strong electric field is thus applied to the tunnel oxide layers of memory cells of a selected block and the data of the selected memory cells are erased as electrons of the floating gates are emitted to the substrate. As sufficient electrons are transferred from the floating gate to the p-well region, the threshold voltage of a selected cell becomes negative. Erasing can be performed on the entire memory array, separate blocks, or another unit of cells.

The erase, read and verify operations described above are performed according to techniques known in the art. Thus, many of the details explained can be varied by one skilled in the art.

During user operation, blocks of memory cells generally undergo an erase verification operation subsequent to being erased. An erase verification operation is performed to insure that all selected cells were successfully erased as a result of an erase pulse. Typically, conduction is tested in a single direction through a string of memory cells to determine if the string is sufficiently erased. For example, conduction in a single direction can be tested by determining if the bit line of a NAND string charges to a predetermined level with all the cells biased to conduct if erased. In this manner, a number of cells can quickly be verified without slowing device performance to an undesirable level.

Figure 6:
FIG. 6 is a table of various bias conditions that can be used in accordance with various embodiments.

For example, erase verify conditions such as those illustrated in column 380 of FIG. 6 can be applied to a string of memory cells to determine if a string is sufficiently erased after applying an erase voltage. An erase voltage is reapplied to strings or blocks failing the verification operation and then the storage elements are verified again to determine if they were successfully erased. Individual memory cells, strings, or blocks can be determined to be defective if they fail a predetermined number of erase verification operations.

Figure 2:
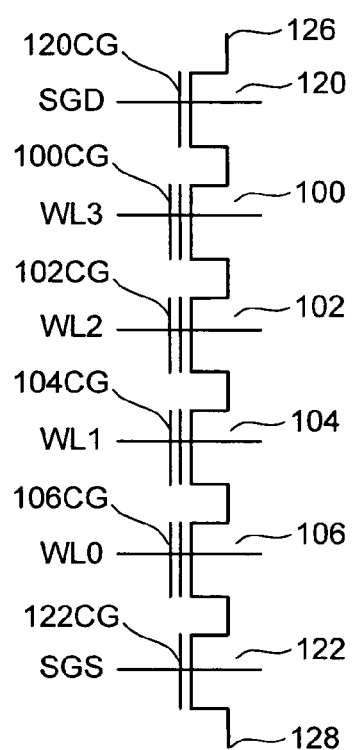
FIG. 2 is an equivalent circuit diagram of the NAND string depicted in FIG. 1.
Figure 3:
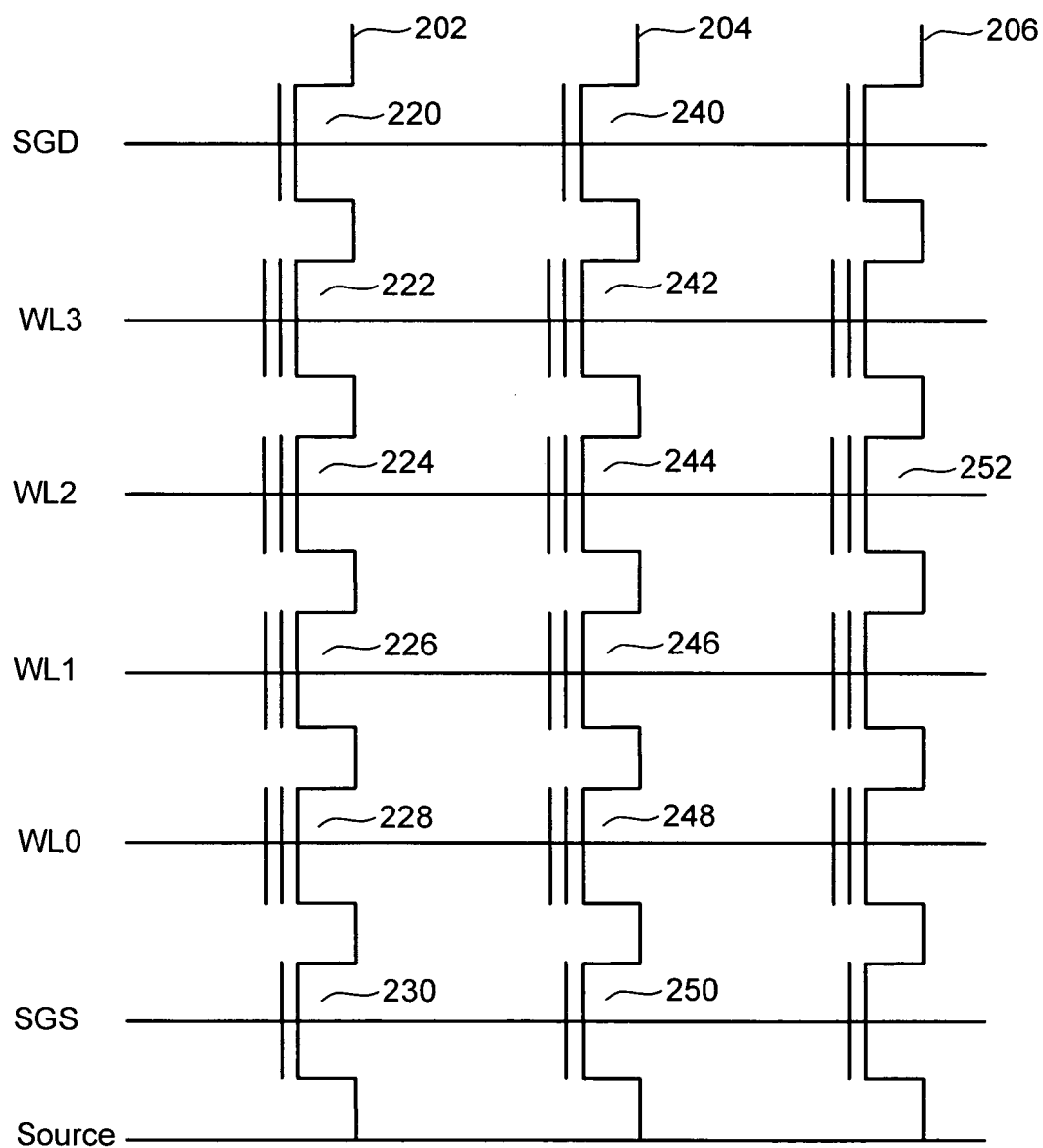
FIG. 3 is a circuit diagram depicting three NAND strings.

Column 380 of FIG. 6 illustrates exemplary erase verification bias conditions that can be used to verify that a NAND string, such as the string illustrated in FIG. 2, is erased after applying an erase voltage to the selected string. Although much of the disclosure is presented with respect to a four cell NAND string, it will be understood that the principles and embodiments described herein can be used with any number of storage elements in a string. Additionally, the actual voltages depicted in FIG. 6 may vary by the needs and characteristics of particular implementations.

With reference to FIG. 2, a read voltage of 5V is applied to select gates 120 and 122 to turn each of them on. The voltages applied to the select gates need not be equal so long as each applied voltage is sufficient to turn on the transistor. The bit line of the string, e.g bit line 126, is grounded while the source, e.g. source line 128, is raised to Vdd (e.g., 2.7V). The control gate of each of the memory cells in the string is grounded or supplied with another voltage that is sufficient to turn an erased memory cell. If each cell is sufficiently erased to a threshold voltage below zero volts (or another gate voltage being applied), the string will conduct and the bit line should begin to charge. If the bit line charges above Vsense (e.g., 1.5V) after some predetermined period of time (e.g., 9.2 usec), it can be determined that the string is sufficiently erased. If the bit line does not charge to Vsense, an erase pulse can be reapplied and the verification operation repeated. If a predetermined number of attempts has already been made to erase the string, the string can be determined to be defective or otherwise unusable.

Although such a verification operation is useful for verifying erasure and detecting some defective strings or sectors, it is unable to detect all defects and fully verify that the string is properly erased.

Figure 1:
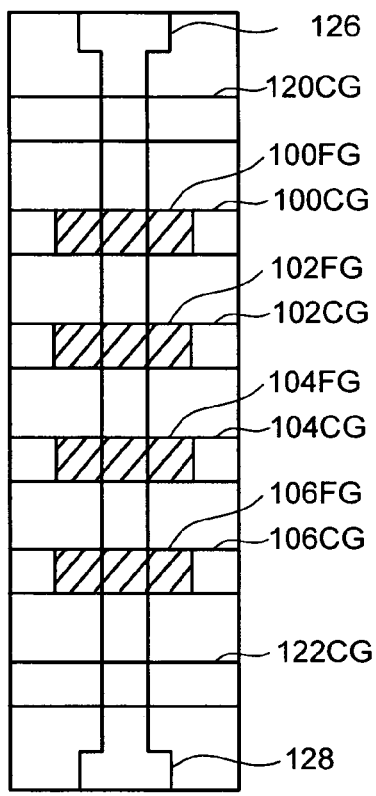
FIG. 1 is a top view of a NAND string.

FIG. 7 is a cross-sectional view of the NAND string depicted in FIGS. 1 and 2. During an erase verify operation, under the indicated bias conditions of FIG. 6, a current flow from the source side to the drain side of the string is induced if the cells are sufficiently erased, as illustrated by arrow 402. Certain defects in transistors such as select gate 120, however, can be masked in such verify operations and thus, go undetected.

Select gates, such as gate 120 and gate 122, can become defective during operation because of various breakdowns of the transistors. For example, a select gate transistor may be damaged due to charges trapped in the oxide layer between the gate and the channel as illustrated in FIG. 7 with respect to gate 120. FIG. 7 depicts a trapping of charge between the control gate of select gate 120 and N+ diffused layer 138 at area 406. Charges can become trapped in the oxide layer after repeated programming and erase operations. The trapped charge can cause a breakdown of the transistor and an apparent increase in the threshold voltage of select gate 120, for example. The increased threshold voltage, as seen from the control gate, can cause a subsequent read operation to improperly read the state of one or more memory cells in the string controlled by the select gate.

During the erase verification operation, each transistor in the string is conductive, causing the left side of select gate 120 or 122 to be at approximately the source side voltage level (e.g., Vdd or 2.7V). This positive voltage at the source side of select gate 120 or 122 may be sufficient to mask any charges trapped in the oxide layer. With the trapped charge masked by the source side voltage, the transistor is able to conduct under the applied gate voltage. The larger potential at the source side of the string will induce a current flow through the channel as indicated by arrow 402, the bit line is able to charge, and the string passes the erase verification operation.

During a subsequent read operation of one or more cells in the string, however, the trapped charge may not be masked and the transistor may not function properly. For example, an erased memory cell may be read as being programmed due to the inability of the string to discharge through the defective gate. Column 384 of FIG. 6 illustrates exemplary bias conditions that may be used to read an individual cell for an erased state. Vcc+Vt (e.g., 4.1V) is applied to each select gate to turn the gate on. Vread (5.0V) is applied to each unselected word line to insure that each unselected cell is turned on, while the word line of the cell selected for reading is grounded or supplied with another voltage sufficient to turn on an erased storage element. After pre-charging the bit line to 0.7V and waiting for a period of time (e.g., 6.7 usec), the bit line charge is sensed. If the bit line discharges to below Vsense (e.g., 0.45V), the selected cell is determined to have turned on under the applied voltage and is verified as in an erased state. If the cell was turned on with 0V applied to its gate, as determined by the bit line discharging to a specified level during a select period of time, the threshold voltage of the selected cell should be below 0V. Thus, the cell is verified as erased.

A trapped charge at select gate 120 or 122, however, may cause the bit line to not properly discharge under the applied bias conditions for a read operation. Select gate 120, for example, may not turn on with 4.7V applied to its control gate due to the trapped charge raising the threshold voltage of the select gate. Under the read bias conditions, 0V will appear at the left side of select gate 120, while Vdd will appear at the drain side. Under these conditions, there is no voltage to mask a trapped charge at the select gate, and thus, the gate may not turn on under conditions designed to turn on a properly operating transistor. Consequently, one or more erased memory cells of the string may improperly be read as programmed.

In accordance with one embodiment, an additional operation is performed after, or as part of, an erase verification operation to more comprehensively determine that a string is erased and functioning properly. The additional operation can test conduction or current flow through the string in a direction opposite to that tested during the initial erase verification operation. In this manner, transistors having defects that are masked during an erase verification operation can be detected by testing conduction in an opposite direction. A NAND string will only be verified as erased if it passes the erase verification test and is also read as in an erased state.

Column 382 of FIG. 6 illustrates a set of bias conditions for reading a string for an erased state in accordance with one embodiment that can be performed to test conduction of the string. A voltage of Vcc+Vt (e.g., 4.1V) is applied to turn on select gates 120 and 122. The voltages applied to the select gates need not be equal so long as each applied voltage is sufficient to turn on the transistor. A verify voltage, which can be any voltage sufficient to turn on an erased memory cell (e.g., 0V), is applied to the word line for each storage element. By applying 0V to the word line for each storage element of the NAND string, each storage element is simultaneously read for an erased state. Or put another way, the entire NAND string is read for an erased state in a single operation. The bit line is precharged to a level of 0.7V, for example, while the source line is grounded. With the bias conditions so applied, a current in the direction of arrow 404 (see FIG. 7) is induced in the channel of the NAND string if each cell is erased and the select gates are functioning properly. After pre-charing the bit line to 0.7V and waiting a period of time, the voltage at the bit line is sensed. If the bit line discharges below Vsense (e.g., 0.45V) after a period of time (e.g., 6.7 usec), the string is read as being in an erased state. If however, the bit line does not discharge in the specified time, the string is read as programmed. Even with each memory cell properly erased to a sufficiently low threshold voltage, the bit line may not discharge. For example, if select gate 120 or 122 is defective, it may not turn on under the applied bias conditions. Thus, the current flow from the drain to the source is blocked and the string will not discharge.

In this manner, an additional verification to determine if the string is erased is performed. By checking for a current flow in a direction opposite to that checked during an erase verification operation, a more comprehensive verification of an erased condition and detection of defective cells can be accomplished. Defects that may have been masked during the initial erase verification can be detected to provide improved erase verification and to allow defective portions of the memory to be mapped out.

Figure 8:
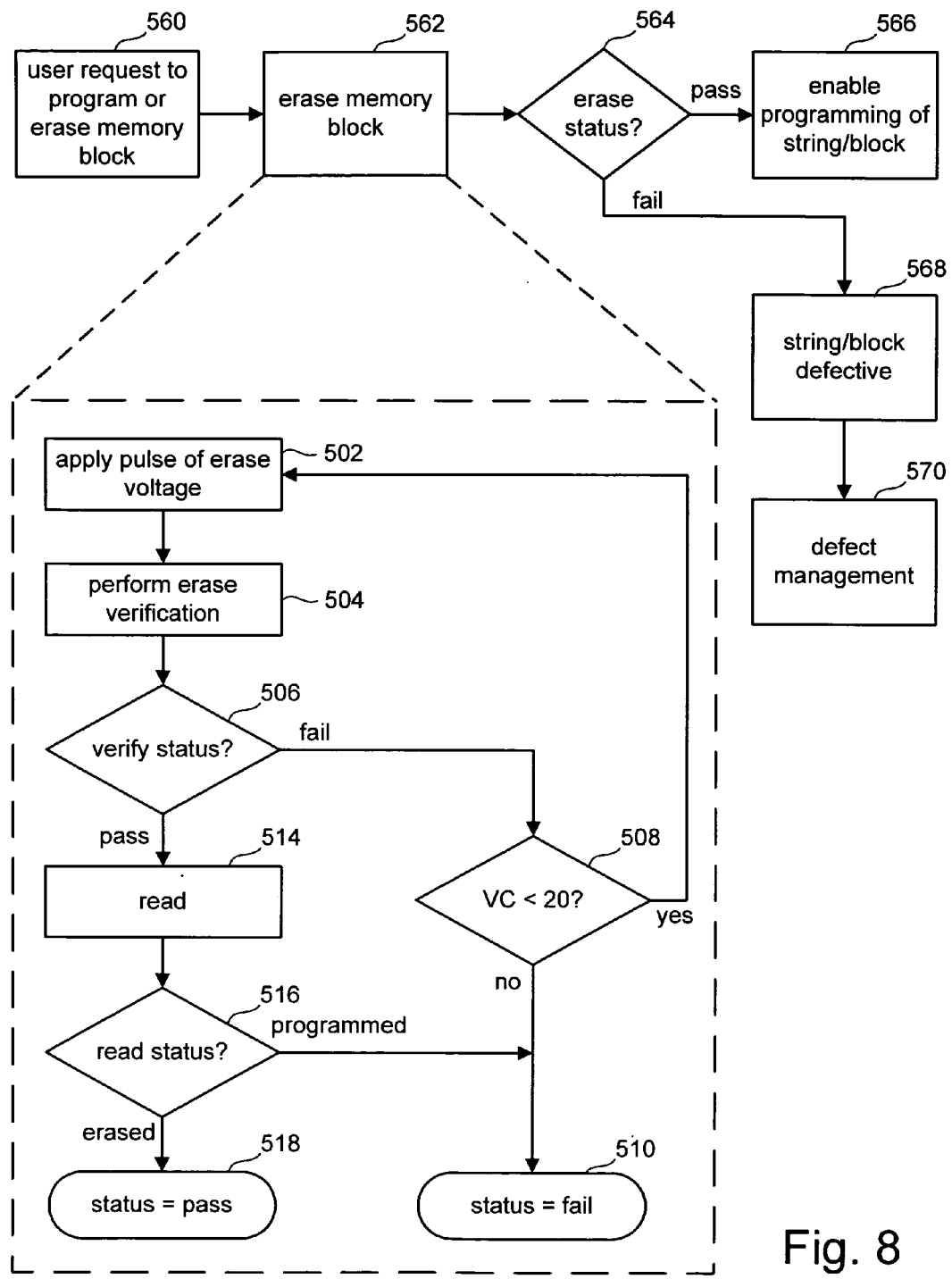
FIG. 8 is a flowchart for erasing storage elements during user operation in accordance with one embodiment.

FIG. 8 is a flowchart of a method for performing a more comprehensive erase verification during user operation in accordance with one embodiment. At step 560, a user request to erase or program a block or other unit of memory cells is received by controller 318. This request can come from any number of host devices in communication with the memory system. Address data designating one or more sectors or divisions thereof can be input to data input/output buffer 312 from controller 318 where it is recognized and latched by state machine 316. Controller 318, state machine 316, and the various control circuits decode and select the physical sectors corresponding to the request. At step 562, one or more selected memory blocks are erased. In one embodiment, a block is erased according to the method illustrated in the expanded box of step 562. The illustrated steps can be used to erase one or more strings of one or more blocks. For example, in one embodiment, a plurality of strings comprising a block are simultaneously erased in parallel according to the illustrated steps.

An erase voltage or pulse is applied to one or more sectors at step 502. Any number of means for erasing memory cells can be used in accordance with various embodiments. At step 504, a string of storage elements are verified for an erased state according to column 380 of FIG. 6. Conduction through the string in a first direction is verified at step 504 under conditions to turn on all erased memory cells in the string. At step 506, the status of the erase verification is determined. If the string was not minimally conductive (e.g, the bit line did not sufficiently charge under the applied conditions), operation proceeds to step 508 where a verify count is compared with a threshold number of verify attempts (e.g., 20). If the count is below a threshold value, the method continues at step 502 where an erase pulse or voltage is applied to the selected sector again. If the count has exceeded the threshold value, the string and/or block is determined not to be sufficiently erased and a status of fail is returned for the initial verification at step 510. If it is determined at step 506 that the erase verification was successful, operation proceeds to step 514 where a read for erased state operation according to column 382 of FIG. 6 is performed on the string. In one embodiment, reading the string for an erased state at 514 includes testing conduction or current flow through the string in the opposite direction to that tested in step 504. In one embodiment, each memory cell in the string is simultaneously read for an erased state at step 514 (i.e., the entire NAND string is read for an erased state in a single operation). At step 516, the status of the read for erased state operation is determined. If the string was not read as erased, a status of fail for the erase operation is reported at step 510. If the string was read as erased, a status of pass is reported at step 518.

After performing an erase verification operation and a read for erased state operation on one or more strings of a block of cells, the status of the erase operation is determined at step 564. If the erase verification operation verifies a string as erased and the read for erased state operation reads the string as erased (as illustrated by step 518), the erase operation is determined to have been successful and a status of pass is returned for the erase operation. At step 566, the string or block is enabled for programming in response to the successful erase operation. If, however, the erase verification operation is unable to verify the string as erased, or the erase verification operation verifies the string as erased and the read for erased state operation reads at least one element of the string as programmed (as illustrated by step 510), the erase operation is determined to have failed. At step 568, the string is determined to be defective. At step 570, techniques for accommodating the defective string can be performed. For example, the defective string may be mapped to an alternate string within the block or the entire block may be mapped out of use.

Numerous schemes for handling defective cells, stings, or blocks can be used in accordance with various embodiments. For example, an individual memory cell, string, or block can be mapped to alternate cells, strings, or blocks set aside for such use. In many embodiments, alternate cells or strings are provided at the end of sectors for use in defect mapping. Various defect mapping schemes, including techniques for mapping individual memory cells are more fully described in U.S. Pat. No. 6,684,345, entitiled, "Flash EEprom System," incorporated by reference herein.

Figure 9:
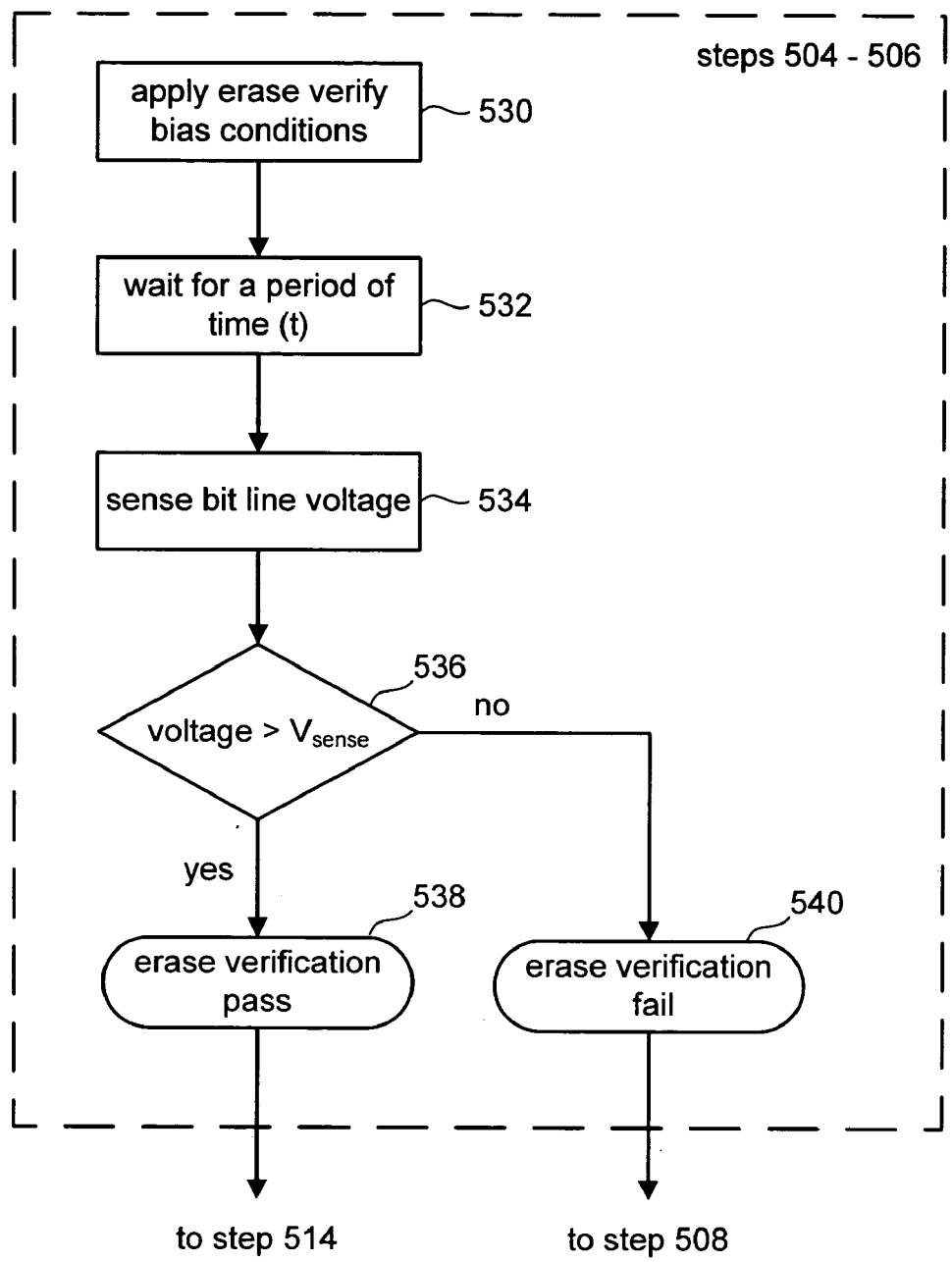
FIG. 9 is a flowchart for performing an erase verification operation in accordance with one embodiment.

FIG. 9 is a flowchart in accordance with one embodiment for performing steps 504–506 of FIG. 8. After attempting to erase a group of cells at step 502, a set of erase verify bias conditions are applied to the string at step 530. In one embodiment, the erase verify bias conditions are substantially as shown in column 380 of FIG. 6. These bias conditions are used to test for proper current flow or conduction in a first direction through the string under conditions sufficient to turn on all erased cells of the string. Step 532 illustrates a delay for a period of time (t) before sensing the voltage at the bit line. The time period will vary by embodiment but is established at a time sufficient for the bit line to charge to a level indicating that the string is conductive under the applied conditions. After waiting the predetermined amount of time (t), the bit line voltage is sensed using any number of means for determining the voltage thereof at step 534.

At step 536, the sensed bit line voltage is compared to a reference voltage level such as Vsense. If the bit line has charged above the threshold level, a status of pass is reported at step 538 for the erase verification process. If the bit line has not charged above the reference voltage during the period of time, a status of fail is reported at step 540. From steps 538 and 540, operation continues to step 514 or step 508 of FIG. 8. It will be appreciated that the voltages discussed are exemplary and may be modified in a given implementation. For example, the values of Vsense and (t) can be modified to test for a different level of charge at a different time. If Vsense is increased, the period of time before sensing the bit line voltage can be increased by a corresponding amount. Because the bit line takes some period of time to charge under the applied bias conditions, the amount of time before sensing the bit line voltage should be selected to correspond to the time at which the bit line should reach the chosen voltage level. In this manner, proper operation of the string under the selected bias conditions can be verified.

Figure 10:
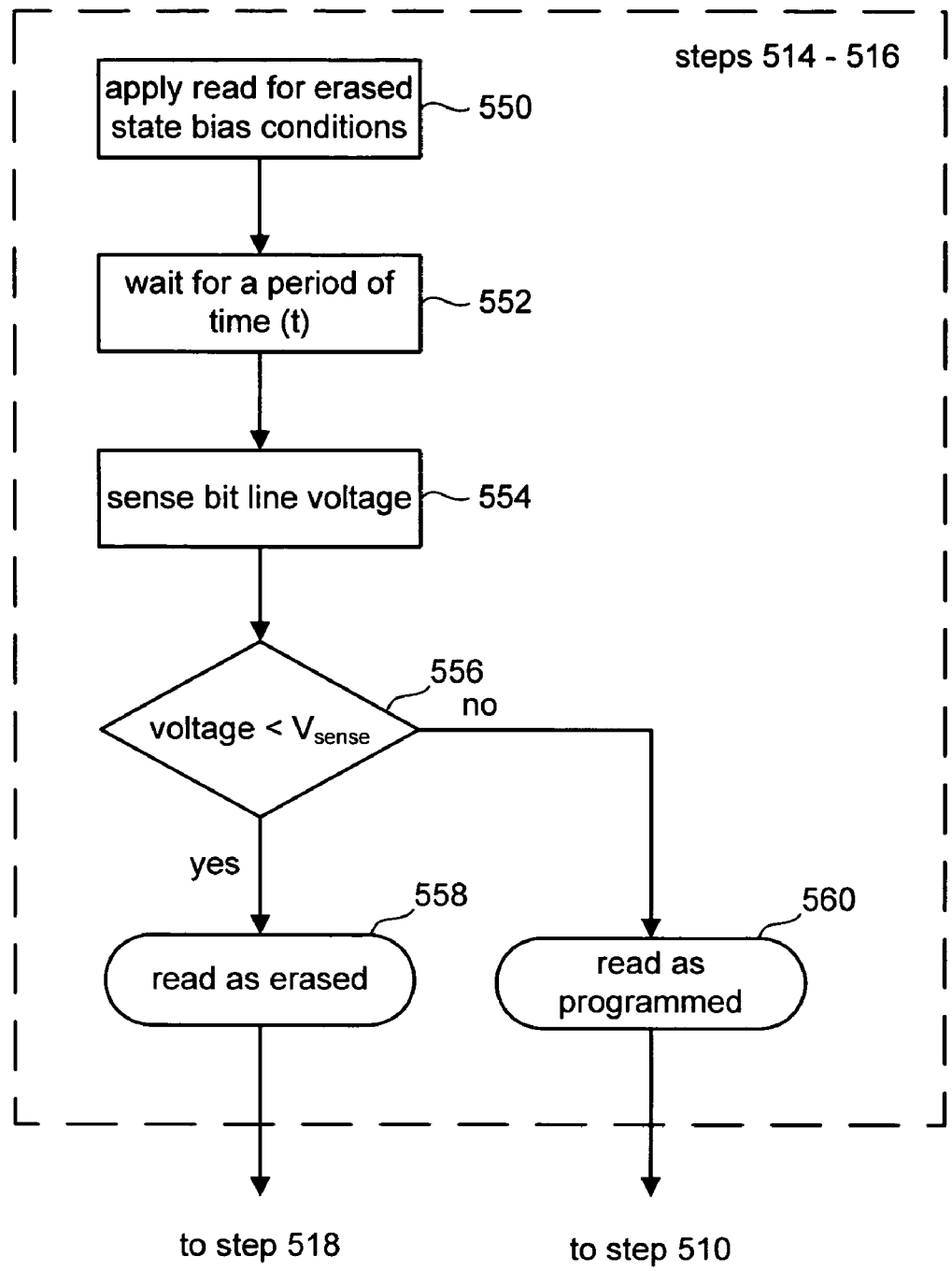
FIG. 10 is a flowchart for reading a group of memory cells for an erased state in accordance with one embodiment.

FIG. 10 is a flowchart in accordance with one embodiment for performing steps 514 and 516 of FIG. 8. After successfully verifying erasure of the string at step 506, a set of bias conditions to read at least one storage element of the string for an erased condition is applied to the string. In one embodiment, each storage element is simultaneously read (entire NAND string is read in a single operation) for an erased state using conditions substantially as shown by the read for erased state bias conditions illustrated in column 382 of FIG. 6. A verify voltage that is sufficient to turn on an erased storage element (e.g., 0V) can be applied to the word line of each element of the string to read the entire string for an erased condition. The bias conditions applied as part of the read for erased state operation test for proper current flow or conduction in a second direction through the string. Step 552 represents a delay for a period of time (t) before sensing the bit line voltage. The time period may vary by embodiment, but as with the erase verification operation, is established at a time sufficient for the bit line to discharge to a level indicating that the string is conductive and operating properly under the applied conditions. In one embodiment, for example, the period of time is 6.7 usec.

After waiting the period of time (t), the bit line voltage is sensed at step 554. At step 556, the sensed bit line voltage is compared to a threshold voltage Vsense (e.g., 0.45V). If the bit line has discharged below Vsense after the period of time (t), a status of erased is returned for the read for erased state operation at step 558. If the bit line has not discharged below Vsense after the period of time, a status of programmed for the read for erased state operation is reported at step 560. From steps 558 and 560, operation continues to steps 518 or 510.

In accordance with the method of FIGS. 8–10, a more comprehensive erase verification of non-volatile memory can be accomplished. By testing conduction through a string of memory cells in two directions, the string can be more fully verified as sufficiently erased. Furthermore, defective elements of the string whose breakdown may be masked during conventional erase verification operations can be detected. For example, a defective select gate whose damaged condition is masked during a typical erase verification operation can be detected. A string that passes an erase verification operation but that is subsequently read as having at least one programmed cell can be determined to have at least one defective device in the string. The string, the column of the string, or the block of the string can be mapped to an alternate location in the memory to accommodate the detected defect.

In various embodiments, a read for erased state operation can be combined with an erase verification operation at one or more steps during an erase sequence. For example, in many multi-state techniques for operating non-volatile storage elements, erased memory cells are subjected to a soft-programming operation prior to programming memory cells to a selected target physical state. When flash memory cells are erased according to one embodiment, the goal is that all erased cells have a negative threshold voltage with a pre-defined range of negative threshold voltages. However, in practice, the erase process may result in some cells having a negative threshold voltage below the predefined range. Memory cells having a threshold voltage that is too low may not subsequently program properly. Thus, some devices will perform what is called a soft program. That is, memory cells with threshold voltages having significantly lower values within the predefined range will receive a small amount of programming so that the threshold voltage is raised to be within the predefined range. After soft-programming, memory cells are verified again to determine if they are in a predefined erased range as result of the soft-programming operation.

In such embodiments utilizing soft-programming techniques, for example, one read for erased state operation is sufficient to adequately test the cell. A read for erased state operation may be performed only after the first successful erase verification operation (i.e., prior to soft-programming). The erase verification operation will verify conduction in a first direction through the string including the cell. The read for erased state will verify conduction, and thus proper operating conditions of the string in the opposite direction. Since proper operation is confirmed by the single read for erased state operation, there is no need to perform a second read for erased state operation following an erase verification operation following soft-programming. In another embodiment, the read for erased state operation can be performed after soft-programming rather than before. In yet other embodiments, the read for erased state operation can be performed at both times.

Although much of the present disclosure has been directed to erase verification and defect detection during user operation of the memory device, the principles and techniques can also be used during manufacturing to provide more comprehensive erase verification and defect detection. As previously discussed, manufacturing testing processes typically involve reading each bit or memory cell of a device. A random pattern may be programmed to an array of memory cells and then each cell read. If the state read from a cell does not match the state for which it was programmed it can be determined to be defective. Additionally, each cell may be read after erasing the array. If a cell reads as programmed after being erased, it can be determined to be defective. In one embodiment, testing is done during manufacturing by using test pins and bypassing the controller of the memory device.

The process of reading each cell during the test process is time-consuming. In accordance with one embodiment, the bias conditions shown in column 382 of FIG. 6 are used to read a string for an erased state during the manufacturing process. Reading the strings of an array for an erased state can replace the previous process of individually reading each cell of the array. For example, after erasing the cell array during the test process, individual strings are read for an erased state under the bias conditions of column 382 (i.e., each cell of the string is simultaneously read for an erased state). Those strings that read as programmed can be determined to be defective. With reading done on a string basis rather than an individual cell basis, the time for reading for an erased state can be decreased substantially. In fact, the time decrease can be a division of the time required to individually read each cell by the number of cells of a string.

In one embodiment, reading the strings of the array for an erased state is incorporated within erase verification during the test process. For example, rather than verify erasure of the array using the bias conditions of column 380 exclusively, an additional verification step is performed under the bias conditions of column 382. Individual strings of the array are only verified as erased if they pass an erase verification under the bias conditions of column of 380 and are read as in an erased state under the conditions of column 382. When the strings are read for an erased state during erase verification, a separate read of each cell for an erased state can be bypassed because the cells have already been tested during erase verification.

Much of the present disclosure has been presented under the assumption that that a verification process is performed by applying a particular voltage to the control gate and determining whether the memory cell turns on or off. However, there are other means of verifying (and reading) a memory cell and other verification parameters to determine the state of a memory cell that can also be used within the spirit of the present invention. For example, a current-sensing system can be used in which a current of the storage unit under a certain read condition is compared with a set of reference currents. In another embodiment, state of a storage unit can be determined using a number of different parameters. For example, the determination of a cell's stored charge level can be performed by current sensing, where the magnitude of its conduction, using fixed bias conditions, is sensed. Alternatively, such determination can be made through sensing threshold voltages, where the onset of such conduction is sensed using various steering gate bias conditions. Alternatively, the determination can be performed dynamically by having the cell's charge-level determined driver-strength control the discharge rate of a dynamically held sense node (by, e.g. a pre-charged capacitor). By sensing the time to reach a given discharge level, the stored charge level is determined. In this case, the parameter indicative of the cells condition is a time. This approach is described in U.S. Pat. No. 6,222,762, incorporated herein by reference in its entirety. Another alternative technique is one in which the state of the storage unit is determined using frequency as the parameter, as described in U.S. Pat. No. 6,044,019, which is hereby incorporated by reference in its entirety. Current sensing approaches are more fully developed in U.S. Pat. No. 5,172,338, which also is incorporated by reference in its entirety.

The above examples are provided with respect to NAND type flash memory. However, the principles of the present invention have application to other types of non-volatile memories, including those currently existing and those contemplated to use new technology being developed.

The foregoing description of embodiments of the present invention has been provided for the purposes of illustration and description. It is not intended to be exhaustive or to limit the invention to the precise forms disclosed. Many modifications and variations will be apparent to the practitioner skilled in the art. Embodiments were chosen and described in order to best describe the principles of the invention and its practical application, thereby enabling others skilled in the art to understand the invention, the various embodiments and with various modifications that are suited to the particular use contemplated. It is intended that the scope of the invention be defined by the following claims and their equivalents.

What is claimed is:

1. A method of erasing non-volatile memory, comprising:
   erasing a group of non-volatile storage elements during user operation;
   performing an erase verification operation to determine if said group of non-volatile storage elements is erased, said performing determines whether there is a first current flow above a first minimum current level in a first direction through said group;
   reading said group of non-volatile storage elements for an erased state, said reading determines whether there is a second current flow above a second minimum current level in a second direction through said group; and
   verifying that said group is erased if said erase verification operation determines that said group is erased and said step of reading reads said group as erased.

2. A method according to claim 1, wherein:
   said step of reading includes simultaneously reading each storage element of said group for an erased state.

3. A method according to claim 2, wherein simultaneously reading each storage element of said plurality comprises:
applying a first voltage to a control gate of each storage element of said group; and
determining whether said second current flow through said group with said first voltage applied is above said second minimum current level.

4. A method according to claim 3, wherein:
said step of reading reads said group as erased if said second current flow is above said first second minimum current level.

5. A method according to claim 1, wherein:
said first minimum current level and said second minimum current level are equal.

6. The method of claim 1, wherein:
said step of performing an erase verification operation determines whether there is a first current flow above a first minimum current level by determining whether a charge at a portion of said group is above a minimum voltage level.

7. A method according to claim 1, wherein:
said reading determines whether said second current flow through said group is above said second minimum current level by determining whether a charge at a portion of said group is below a minimum voltage level.

8. A method according to claim 1, further comprising:
marking said group as defective if said step of performing an erase verification operation determines that said group is erased and said step of reading does not read said at last one storage element as erased.

9. A method according to claim 1, wherein:
said step of performing an erase verification operation includes applying a first set of bias conditions to said group; and
said step of reading includes applying a second set of bias conditions to said group.

10. A method according to claim 9, wherein:
said step of performing an erase verification operation includes determining whether a charge at a first portion of said group is above a minimum level when said first set of bias conditions is applied; and
said step of reading includes determining whether a charge at a second portion of said group is below a maximum level when said second set of bias conditions is applied.

11. A method according to claim 9, wherein:
said step of performing an erase verification operation determines that said group is erased if said charge at said first portion is above said minimum level; and
said step of reading reads said at least one storage element as erased if said charge at said second portion is below said maximum level.

12. A method according to claim 9, wherein:
said step of determining whether a charge at a first portion of said group is above a minimum level determines whether said charge is above said minimum level after a period of time after applying said first set of bias conditions; and
said step of determining whether a charge at a second portion of said group is below a maximum level determines whether said charge is below said maximum level after a period of time after applying said second set of bias conditions.

13. A method according to claim 9, wherein:
said first portion and said second portion are a same portion.

14. A method according to claim 13, wherein:
said group is a NAND string;
said NAND string includes a source side and a drain side, said drain side is coupled to a bit line; and
said same portion is said drain side.

15. A method according to claim 14, wherein:
said NAND string includes a select gate;
said step of applying said first set of bias conditions causes a current flow from said source side to said drain side when said string is erased; and
said step of applying said second set of bias conditions causes a current flow from said drain side to said source side when said string is erased and said select gate is not defective.

16. The method of claim 15, wherein:
said select gate is coupled to said drain side of said string.

17. The method of claim 15, wherein:
said select gate is coupled to said source side of said string.

18. A method according to claim 9, wherein said step of applying a first set of bias conditions includes:
applying a first voltage to each storage element of said group, said first voltage is sufficient to turn on an erased storage element;
applying a second voltage at a source side of said group; and
applying a third voltage at a drain side of said group, said third voltage is less than said second voltage.

19. A method according to claim 9, wherein said step of applying a second set of bias conditions includes:
applying a first voltage to each storage element of said group, said first voltage is sufficient to turn on an erased storage element;
applying a second voltage at a source side of said group; and
applying a third voltage at a drain side of said group, said third voltage is greater than said second voltage.

20. A method according to claim 19, wherein:
said first voltage is not sufficient to turn on a programmed storage element.

21. A method according to claim 1, wherein:
said group is part of a block of storage elements; and
said method further comprises marking said block as defective if said step of performing an erase verification operation determines that said group is erased and said step of reading does not read said at least one storage element as erased.

22. A method according to claim 1, wherein:
said group of non-volatile storage elements are binary storage elements.

23. A method according to claim 1, wherein:
said group of non-volatile storage elements are multi-state storage elements.

24. A method according to claim 1, wherein:
said group of non-volatile storage elements are flash storage elements.

25. A method according to claim 1, wherein:
said group of storage elements is part of an array of storage elements;
said array of storage elements is in communication with a host system; and
said array of storage elements is removable from said host system.

26. A method according to claim 1, further comprising:
enabling a program operation of said group if said step of performing an erase verification operation determines that said group is erased and said step of reading reads said at least one storage element as erased.

27. A method according to claim 8, wherein:
said step of marking said group as defective includes mapping said group to another group of non-volatile storage elements.

28. A method according to claim 2, wherein:
said step of simultaneously reading each storage element comprises performing a NAND string read operation.

29. A method according to claim 1, wherein:
said group of non-volatile storage elements are part of a memory system;
said steps of performing an erase verification operation and reading said group are performed by a controller; and
said controller is part of said memory system.

30. A memory system, comprising:
a group of non-volatile storage elements located in a host system, said group includes a source side and a drain side; and
a managing circuit in communication with said group, said managing circuit causes an erase operation to be performed for said group, said managing circuit performs an erase verification operation to determine whether said group is erased and reads at least one non-volatile storage element of said group for an erased state after erasing said group, said managing circuit reads said at least one non-volatile storage element for an erased state by applying a first voltage sufficient to turn on an erased storage element to each non-volatile storage element of said group, applying a second voltage at said source side, and applying a third voltage at said drain side, said third voltage is greater than said second voltage, wherein said managing circuit verifies that said group is erased when said erase verification operation determines that said group is erased and said at least one non-volatile storage element is read as erased.

31. A memory system according to claim 30, wherein:
said group of non-volatile storage elements are connected in series.

32. A memory system according to claim 30, wherein:
said group is a NAND string.

33. A memory system according to claim 30, wherein:
said managing circuit simultaneously reads each storage element of said group for an erased state, wherein said managing circuit applies said first voltage to each storage element of said group and determines whether a current flow through said group with said first voltage applied is above a minimum current level to simultaneously read each storage element.

34. A memory system according to claim 30, wherein:
said group of non-volatile storage elements are multi-state NAND flash memory devices.

35. A memory system according to claim 30, wherein:
said memory system further comprises an array of storage elements;
said group is part of said array; and
said array is removable from said host system.

36. A memory system according to claim 30, wherein:
said managing circuit includes at least one of a controller and a state machine.

37. A memory system according to claim 30, wherein:
said managing circuit performs said erase verification operation and reads at least one storage element during user operation of said memory system.

38. A method of operating non-volatile memory, comprising:
performing a plurality of programming operations to store user data in a memory system; and
performing a plurality of erase operations to erase said user data, wherein at least one of said erase operations includes the steps of:
erasing a group of non-volatile storage elements of said memory system;
performing an erase verification operation to determine whether said group is erased after said step of erasing, said performing includes determining whether a charge at a first portion of said group is above a minimum level,
reading at least one non-volatile storage element of said group for an erased state, said reading includes determining whether a charge at a second portion of said group is below a maximum level, and
verifying that said group is erased if said step of performing an erase verification operation determines that said group is erased and said step of reading reads said at last one storage element as erased.

39. A method according to claim 38, wherein:
said step of reading includes reading said group for an erased state, wherein reading said group includes simultaneously reading each storage element of said group by applying a set of bias conditions to said group and testing conduction in a first direction through said group.

40. A method according to claim 39, wherein:
said step of performing an erase verification operation tests conduction in a second direction through said group.

41. A method according to claim 38, wherein:
said group of non-volatile storage elements are multi-state flash storage elements.

42. A method according to claim 38, wherein:
said group is part of an array of storage elements;
said array is in communication with a host system; and
said array is removable from said host system.

43. A method according to claim 38, wherein:
said group of non-volatile storage elements are part of a memory system;
said step of performing a plurality of erase operations is performed by a controller; and
said controller is part of said memory system.

44. A method of erasing non-volatile memory, comprising:
erasing a group of non-volatile storage elements during user operation;
performing an erase verification operation to determine if said group of non-volatile storage elements is erased;
reading said group of non-volatile storage elements for an erased state, said reading includes applying a first voltage sufficient to turn on an erased storage element to each non-volatile storage element of said group, applying a second voltage at a source side of said group, and applying a third voltage at a drain side of said group, said third voltage is greater than said second voltage; and
verifying that said group is erased if said erase verification operation determines that said group is erased and said step of reading reads said group as erased.

45. A method according to claim 44, wherein:
said performing an erase verification operation determines whether there is a first current flow above a first minimum current level in a first direction through said group.

46. A method according to claim 45, wherein:
said reading said group determines whether there is a second current flow above a second minimum current level in a second direction through said group.

47. A method according to claim 46, wherein:
said performing an erase verification operation determines whether there is a first current flow above a first minimum current level by determining whether a charge at a first portion of said group is above a minimum voltage level; and
said reading said group determines whether there is a second current flow above a second minimum current level by determining whether a charge at a second portion of said group is below a maximum voltage level.

48. A method according to claim 47, wherein:
said first portion and said second portion are a same portion; and
said minimum voltage level and said maximum voltage level are equal.

49. A method according to claim 44, wherein:
said performing an erase verification operation includes applying a first set of bias conditions to said group; and
said reading said group includes applying a second set of bias conditions to said group.

50. A non-volatile memory system, comprising:
a group of non-volatile storage elements located in a host system; and
a managing circuit in communication with said group, said managing circuit causes an erase operation to be performed for said group, said managing circuit performs an erase verification operation to determine whether said group is erased and reads at least one non-volatile storage element of said group for an erased state after erasing said group, said managing circuit reads said at least one non-volatile storage element by testing conduction in a first direction through said group and performs said erase verification operation by testing conduction in a second direction through said group, said managing circuit verifies that said group is erased when said erase verification operation determines that said group is erased and said at least one non-volatile storage element is read as erased.

51. A method according to claim 50, wherein:
testing conduction in a first direction includes determining whether a charge at a first portion of said group is below a maximum level while applying a first set of bias conditions to said group; and
testing conduction in a second direction includes determining whether a charge at a second portion of said group is above a minimum level while applying a second set of bias conditions to said group.

52. A method according to claim 51, wherein:
said first portion and said second portion are a same portion.

53. A method according to claim 51, wherein applying said first set of bias conditions includes:
applying a first voltage to each storage element of said group, said first voltage is sufficient to turn on an erased storage element;
applying a second voltage at a source side of said group; and
applying a third voltage at a drain side of said group, said third voltage is greater than said second voltage.

54. A method according to claim 51, wherein applying said second set of bias conditions includes:
applying a first voltage to each storage element of said group, said first voltage is sufficient to turn on an erased storage element;
applying a second voltage at a source side of said group; and
applying a third voltage at a drain side of said group, said third voltage is less than said second voltage.

55. A method of operating non-volatile memory, comprising:
performing a plurality of programming operations to store user data in a memory system; and
performing a plurality of erase operations to erase said user data, wherein at least one of said erase operations includes the steps of:
erasing a group of non-volatile storage elements of said memory system;
performing an erase verification operation to determine whether said group is erased after said step of erasing, said erase verification operation tests conduction in a first direction through said group,
reading at least one non-volatile storage element of said group for an erased state, said reading tests conduction in a second direction through said group, and
verifying that said group is erased if said step of performing an erase verification operation determines that said group is erased and said step of reading reads said at last one storage element as erased.

56. A method according to claim 55, wherein:
testing conduction in a first direction includes determining whether a first current flow through said group is above a first minimum current level while applying a first set of bias conditions; and
testing conduction in a second direction includes determining whether a second current flow through said group is above a second minimum current level while applying a second set of bias conditions to said group.

57. A method according to claim 56, wherein:
said first minimum current level and said second minimum current level are equal.

58. A method according to claim 56, wherein applying said first set of bias conditions includes:
applying a first voltage to each storage element of said group, said first voltage is sufficient to turn on an erased storage element;
applying a second voltage at a source side of said group; and
applying a third voltage at a drain side of said group, said third voltage is less than said second voltage.

59. A method according to claim 56, wherein applying said second set of bias conditions includes:
applying a first voltage to each storage element of said group, said first voltage is sufficient to turn on an erased storage element;
applying a second voltage at a source side of said group; and
applying a third voltage at a drain side of said group, said third voltage is greater than said second voltage.

* * * * *